(12) United States Patent
Li et al.

(10) Patent No.: US 8,076,708 B2
(45) Date of Patent: Dec. 13, 2011

(54) STRUCTURES FOR AND METHOD OF SILICIDE FORMATION ON MEMORY ARRAY AND PERIPHERAL LOGIC DEVICES

(75) Inventors: Yi-Hung Li, Kaohsiung (TW);
Jen-Chuan Pan, Kaohsiung (TW);
Jongoh Kim, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 384 days.

(21) Appl. No.: 12/403,602

(22) Filed: Mar. 13, 2009

(65) Prior Publication Data

US 2009/0173990 A1     Jul. 9, 2009

Related U.S. Application Data

(62) Division of application No. 11/672,150, filed on Feb. 7, 2007, now Pat. No. 7,517,737.

(51) Int. Cl.
*H01L 29/76*     (2006.01)

(52) U.S. Cl. .................. 257/314; 438/142; 257/E21.691

(58) Field of Classification Search .................. 438/257, 438/258, 314, 315, 263, 142; 257/314–317, 257/324, 321, E21.689, E21.691
See application file for complete search history.

(56) References Cited

U.S. PATENT DOCUMENTS

| 6,136,636 | A  | 10/2000 | Wu et al. |
| 6,316,293 | B1 | 11/2001 | Fang |
| 6,461,906 | B1 | 10/2002 | Lung |
| 6,566,194 | B1 | 5/2003  | Ramsbey et al. |

*Primary Examiner* — David Vu
(74) *Attorney, Agent, or Firm* — Haynes Beffel & Wolfeld LLP

(57) ABSTRACT

A memory device and peripheral circuitry on a substrate are described, made by a process that includes forming a charge trapping structure having a first thickness over a first area. A first gate dielectric layer having a second thickness is formed for low-voltage transistors. A second gate dielectric layer having a third thickness, greater than the second thickness, is formed for high-voltage transistors. Polysilicon is deposited and patterned to define word lines and transistor gates. The thickness of the second gate dielectric layer in regions adjacent the gates, and over a source and drain regions, is reduced to a thickness that is close to that of the second thickness.

2 Claims, 10 Drawing Sheets

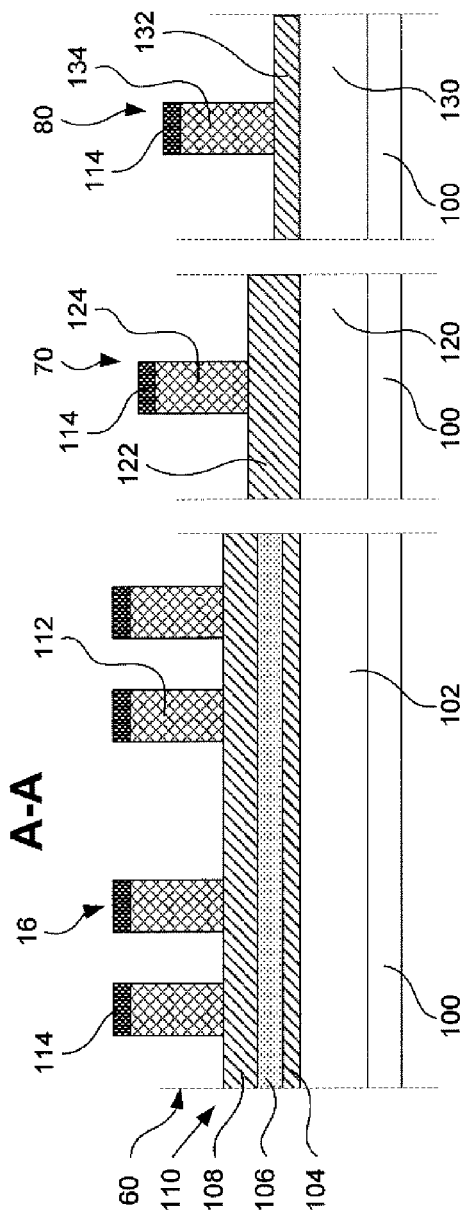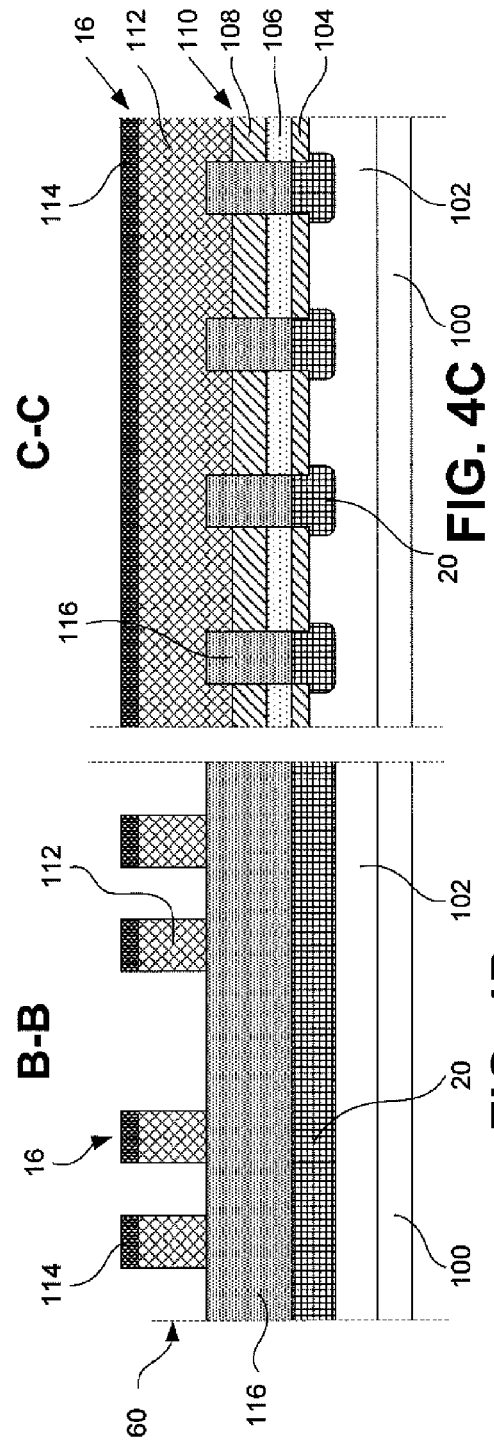

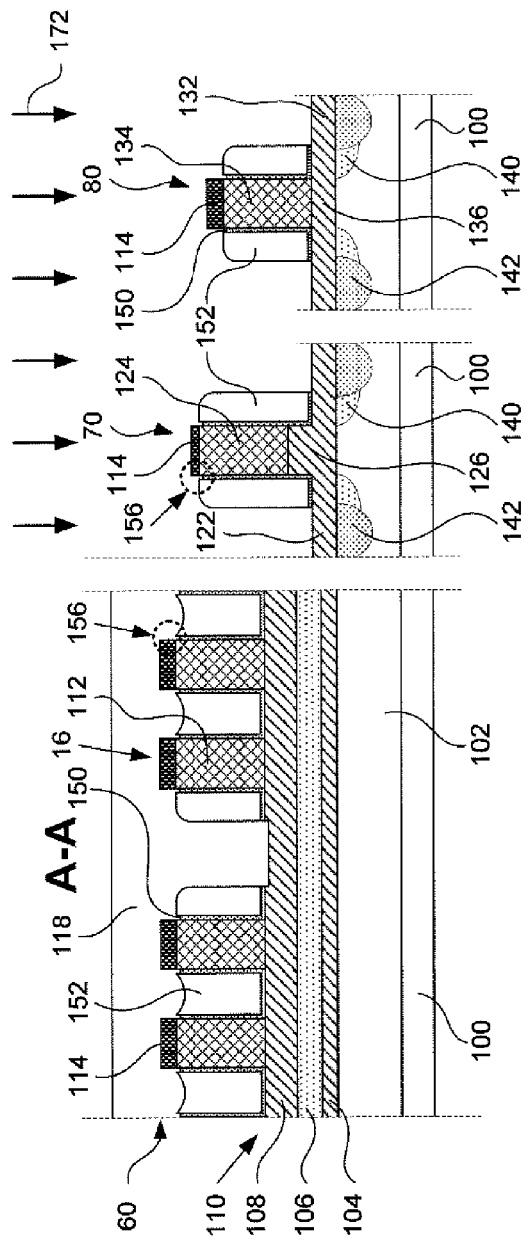
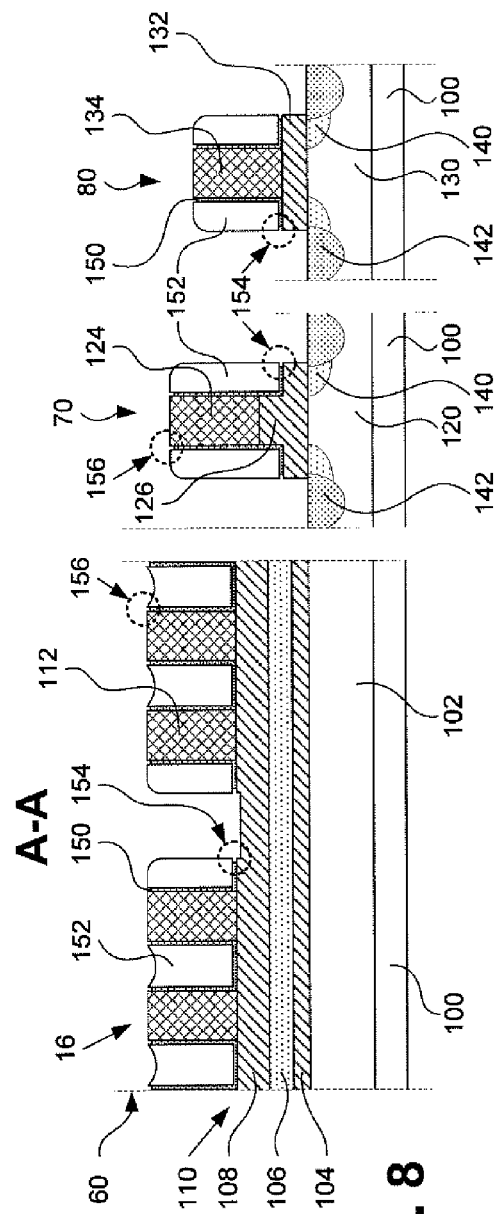
FIG. 7
FIG. 8

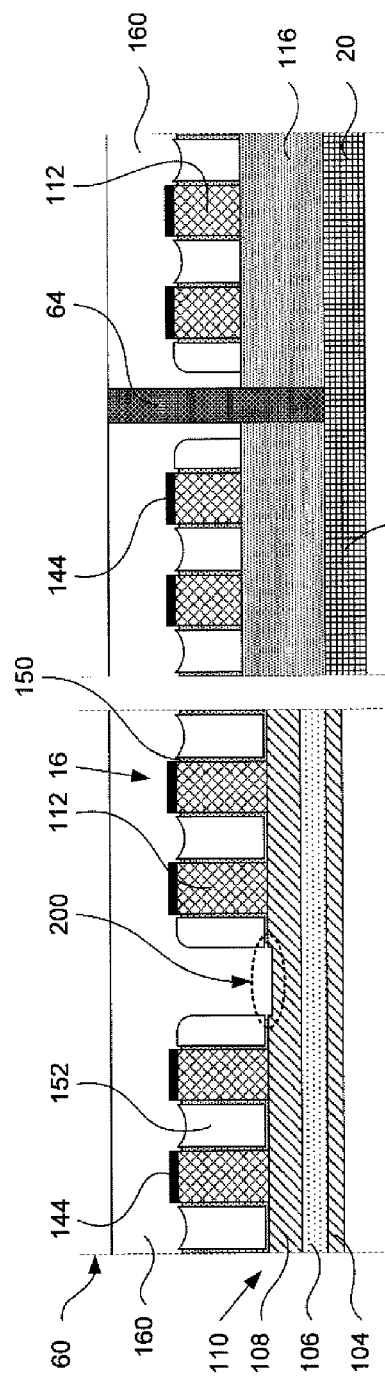
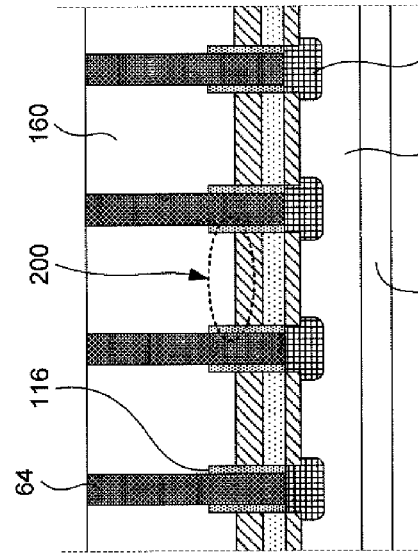
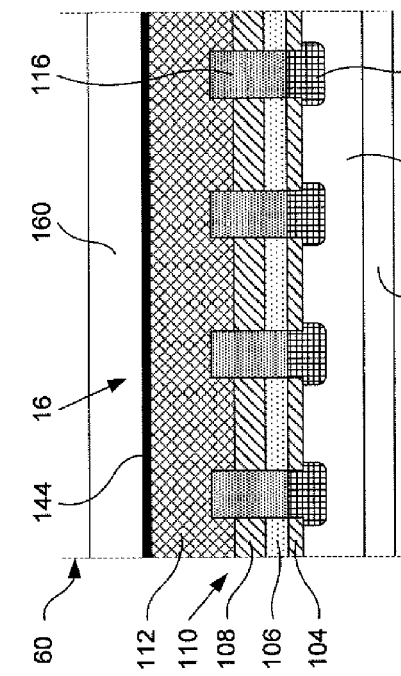
FIG. 10A
FIG. 10B
FIG. 10C
FIG. 10D

STRUCTURES FOR AND METHOD OF SILICIDE FORMATION ON MEMORY ARRAY AND PERIPHERAL LOGIC DEVICES

RELATED APPLICATIONS

This application is a divisional of U.S. patent application Ser. No. 11/672,150, filed on 7 Feb. 2007.

BACKGROUND OF THE INVENTION

The technology disclosed relates to high-density integrated circuits. In particular, the technology disclosed relates to the fabrication of memory cells and their associated peripheral circuits in integrated circuit devices that include non-volatile memory.

There is a present need to increase the operational speed of non-volatile memory devices. To accomplish this, various techniques have been implemented in device processing and structural designs. For example, reducing the feature dimensions of non-volatile memory devices typically increases their operational speed. Another way of accomplishing this involves reducing the spacing between the memory cell control gates by fabricating bit lines that may serve as transistor sources and/or drains. The operational speed of non-volatile memory devices has also been increased by minimizing the spacing between contacts. Siliciding the gate structures of a memory array has also increased operational speed by reducing gate electrical resistance, thus reducing response delays. In some cases, siliciding has been achieved by employing a self-aligned process referred to in the art as saliciding.

Bit line shorting as a result of a salicide process has been a problem in some prior art manufacturing processes. For example, U.S. Pat. No. 6,566,194, issued May 20, 2003, discloses "processes for doping and saliciding word lines in a virtual ground array flash memory device without causing shorting between bit lines. According to one aspect of the method, word lines are doped prior to patterning the poly layer from which the word lines are formed in the core region. Thereby, the poly layer protects the substrate between the word lines from doping that could cause shorting between bit lines. According to another aspect of the method, word lines are exposed while spacer material, dielectric, or like material protects the substrate between word lines. The spacer material or dielectric prevents the substrate from becoming salicided in a manner that, like doping, could cause shorting between bit lines." (U.S. Pat. No. 6,566,194, Abstract)

U.S. Pat. No. 6,136,636, issued Oct. 24, 2000, discloses a method of reducing resistance in deep sub-micron CMOS transistors by forming ultra-shallow source and drain structures and then forming salicide structures on the exposed substrate and gate.

The difficulties involved in manufacturing non-volatile memory devices are increased by the differing types of circuitry they include. For example, non-volatile memory devices include a memory cell array and various peripheral circuitry functions. The memory cell array includes memory cells having control gates, charge trapping structures such as floating gates or charge trapping dielectrics, and source and drain regions. The control gates can be connected together by word lines. The source and drain regions can be connected in series or in parallel by bit lines. The peripheral circuitry can include field effect transistors adapted for high- or low-voltage operation by use of gate dielectrics with different thicknesses, and can include functions such as decoders, charge pumps and control circuitry to facilitate the programming, reading, and erasing of data in the cells of the memory cell array.

It is desirable to provide memory technology for nonvolatile memory that supports the manufacture of memory arrays, including virtual ground memory arrays, without bit line shorting.

SUMMARY OF THE INVENTION

An improved method of fabricating a memory device and peripheral circuitry on a semiconductor substrate is provided, along with a novel integrated circuit structure. The method includes fabricating a memory device and peripheral circuitry on a substrate, wherein the memory cells include source and drain regions without silicide layers, and transistors in the peripheral circuitry include source and drain regions with silicide layers, and further wherein the peripheral circuitry includes both low-voltage and high-voltage transistors with different gate dielectric thicknesses.

A method as described herein includes forming a multilayer charge trapping structure over a first area of the substrate. The multilayer charge trapping structure has a first thickness, and includes a top layer of dielectric, a bottom layer of dielectric and a charge trapping layer or charge trapping layers between the top layer and the bottom layer. Also, a first gate dielectric layer having a second thickness is formed over a second area of the substrate, in which low-voltage transistors are to be implemented. A second gate dielectric layer having a third thickness, greater than the second thickness, is formed over a third area of the substrate, in which high-voltage transistors are to be implemented. A gate material, such as polysilicon or other silicon containing conductor in preferred systems, is deposited and patterned over the first, second and third areas of the substrate to define word lines in the first area, and transistor gates in the second and third areas. Embodiments of the method described herein includes selectively etching in the third area to reduce the thickness of the second gate dielectric layer in regions adjacent the gates, and over a source and drain regions, to a thickness that is close to that of the second thickness. The thickness which is "close to that of the second thickness" can be defined as close enough to the second thickness that the steps required for removing the gate dielectric material having a second thickness are not substantially changed in a length of time or chemistry of the etch, in order to remove the gate dielectric material having said thickness which is close to that of the second thickness. After reducing the thickness of the second gate dielectric layer, dopants are implanted aligned with the gates in the second and third areas for formation of source and drain regions in the second and third areas. Next, a dielectric spacer material, such as silicon nitride, is deposited over the word lines and gates in the first, second and third areas. The dielectric spacer material is etched to form sidewall spacers on the gates, and to expose the charge trapping structure in a bit line contact region in the first area. In addition, the etching of the dielectric spacer material exposes the first and second dielectric layers in source and drain regions adjacent the sidewall spacers in the second and third areas. Next, dopants are implanted aligned with the sidewall spacers in the second and third areas for completion of the formation of source and drain regions in these areas of the substrate. Then, the first and second gate dielectric layers are selectively etched to expose the substrate adjacent the sidewall spacers in the second and third areas, and expose the tops of word lines and gates in the first, second and third areas without exposing the substrate in the bit line contract regions.

Silicide is formed on the exposed substrate, preferably using a self-aligned silicide formation process, over the source and drain regions adjacent the sidewall spacers in the second and third areas, and on the word lines and gates in the first, second and third areas.

At least a portion of the charge trapping structure, which remains in the bit line contact regions during the silicide process acts as a mask to prevent silicide formation in the bit line contact regions. An interlayer dielectric is formed over the word lines in first areas and over the gates in the second and third areas. Bit line contacts through the interlayer dielectric are formed in the bit line contact regions in the first area. Because no silicide is formed in that region, shorts between bit line contacts are prevented. Similar contacts are formed through the interlayer dielectric in the peripheral regions. One or more patterned conductor layers are formed over the interlayer dielectric for interconnection of the components on the integrated circuit as known in the art. The bit line contacts and similar contacts in the peripheral regions act to connect doped regions in the substrate to the patterned conductor layers through the interlayer dielectric.

In embodiments of the method, a protective cap material, such as silicon dioxide, is formed on the word lines in the first area and gates in the second area, and protects the word lines and gates during the etching of the dielectric spacer material. The cap is removed before forming the silicide.

Also, in some embodiments of the method, a dielectric liner is formed over the word lines in the first area and the gates in the second and third areas before depositing the dielectric spacer material. At least of portion of the dielectric liner can be removed during the etch of the dielectric spacer material which results in formation of the sidewall spacers.

An integrated circuit is described herein which includes a memory array in a first area of a substrate. The memory array includes a plurality of word lines comprising conductive material including a silicide layer. A plurality of bit lines in the memory array comprise doped substrate regions. A plurality of memory cells in the memory array comprise source and drain regions in the plurality of bit lines and a multilayer charge trapping structure having a first thickness. The multilayer charge trapping structure includes a top layer of dielectric, a bottom layer of dielectric and a charge trapping layer or charge trapping layers between the top layer and the bottom layer. An interlayer dielectric layer and a conductor structure overlie the memory array. Bit line contacts, connecting the conductor structure to the bit lines in the plurality of bit lines through the interlayer dielectric are included in areas between groups of word lines in the plurality of word lines. Material deposited during the formation of the charge trapping structures overlies the substrate beneath the interlayer dielectric between the bit line contacts, providing a mask as described above during the silicide formation process used for forming the silicide layer in the word lines. A first set of transistors is included on the substrate having gate dielectrics with a second thickness, adapted for lower voltage operation. A second set of transistors is included on the substrate having gate dielectrics with a third thickness, greater than the second thickness, adapted for higher voltage operation.

Embodiments of the integrated circuit including at least one transistor adapted for higher voltage operation with a gate dielectric having the third thickness, includes a gate with a dielectric sidewall spacer having a bottom surface. A layer of the material used for the gate dielectric is between the bottom surface of the sidewall spacer and the substrate, which has a thickness close to that of the second thickness.

Other aspects and advantages of the technology discussed herein can be seen on review of the drawings, the detailed description, and the claims, which follow.

BRIEF DESCRIPTION OF THE DRAWINGS

FIGS. 4A-4C show sectional views along lines AA, BB, and CC of FIG. 3 after forming memory cell word lines, and a sectional view of peripheral transistors after forming their gates.

FIG. 7 is a sectional view along line AA of FIG. 3 after protecting the memory cells, and a sectional view of peripheral transistors illustrating a dopant implantation step to form source and drain regions.

FIG. 8 is a sectional view along line AA of FIG. 3 and a sectional view of peripheral transistors, illustrating a pre-silicide deposition cleaning step.

FIGS. 10A-10D show sectional views along lines AA, BB, CC, and DD of FIG. 3, illustrating salicide deposition and bit line contacts formation.

DETAILED DESCRIPTION

The following detailed description is made with reference to embodiments illustrated by the figures. These embodiments are described to illustrate the method, not to limit its scope, which is defined by the claims. Those of ordinary skill in the art will recognize a variety of equivalent variations on the best mode description that follows.

Figure 1:
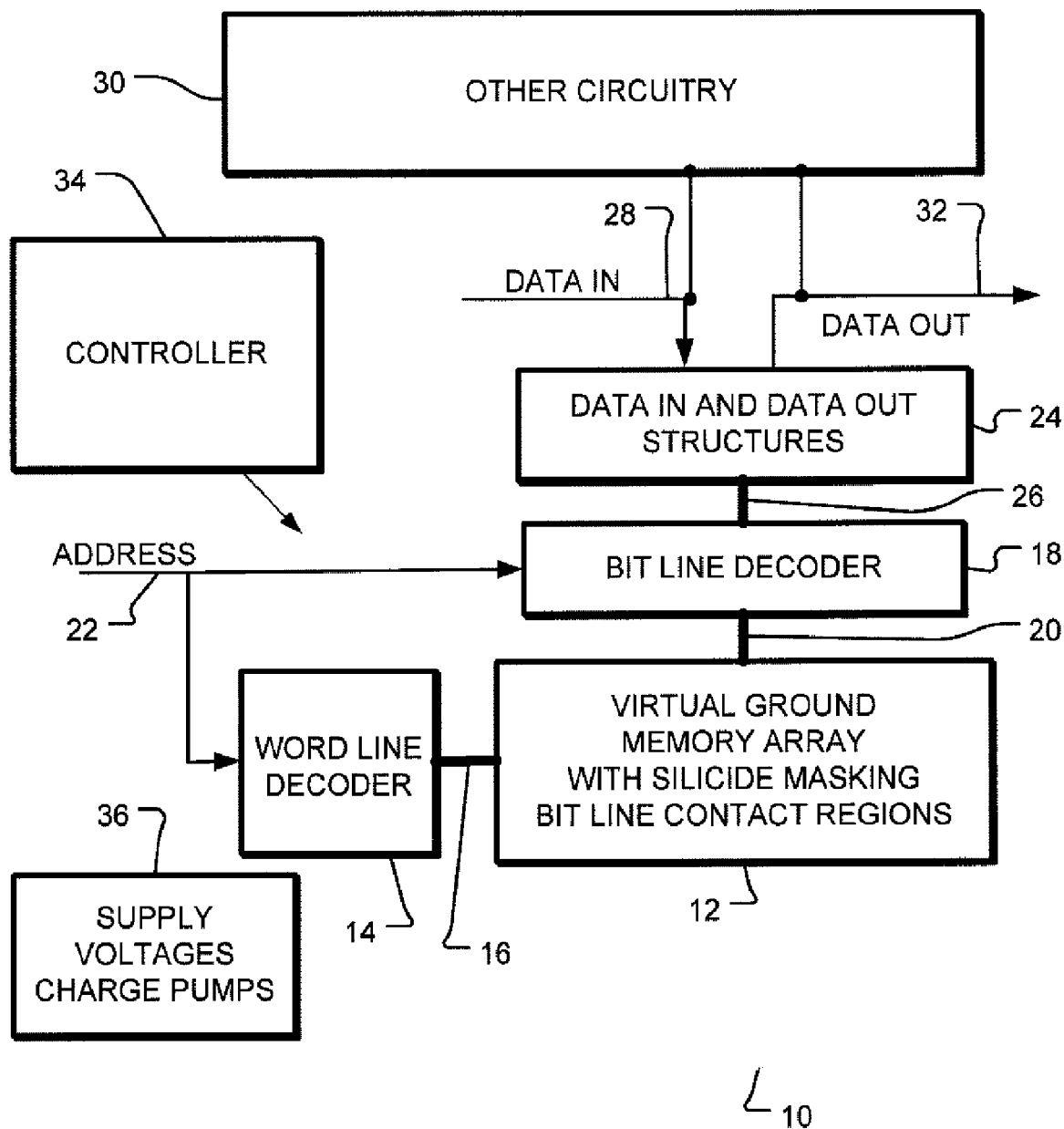
FIG. 1 is a block diagram of an integrated circuit device including a charge trapping memory array and other circuitry.

FIG. 1 shows a simplified block diagram of integrated circuit 10 fabricated in accordance with the technology discussed herein. Integrated circuit 10 includes a memory array 12. The memory array 12 includes charge trapping memory cells, and bit line contact regions covered by the material used for charge trapping structures that act as silicide masks. A word line decoder 14 is coupled to word lines 16, and a bit line decoder 18 is coupled to bit lines 20, to permit operations that comprise reading data from, and writing data to, the non-volatile memory cells of array 12. To perform operations on memory array 12, addresses may be supplied on address lines 22 to word line decoder 14 and bit line decoder 18. Data-in and data-out structures 24 are coupled to bit line decoder 18 via data bus 26. Data is supplied via a data-in bus 28 from input/output ports on integrated circuit 10, or from other data sources internal or external to integrated circuit 10, to the data-in structures in block 24.

Other circuitry 30 may be included on integrated circuit 10, such as a general purpose microprocessor or circuitry specific to one or more applications, or a combination of circuit modules providing functionality comprising data storage by memory array 12. Data is supplied via a data-out bus 32 from the sense amplifiers in block 24 to input/output ports on integrated circuit 10, or to other data destinations internal or external to integrated circuit 10. A controller 34 implemented in this example, controls the application of supply voltages charge pumps 36, to perform operations such as read, program, erase, erase verify and program verify voltages on the memory cells of memory array 12. Controller 34 may be implemented using special-purpose logic circuitry as known in the art.

The circuitry of integrated circuit 10 not included in array 12 is commonly referred to as peripheral circuitry and may comprise high voltage and/or low voltage field effect transistors, having different gate dielectric thicknesses, to implement supply voltage charge pumps 36, a word line decoder 14, a bit line decoder 18, a controller 34, and other peripheral circuitry.

Figure 2:
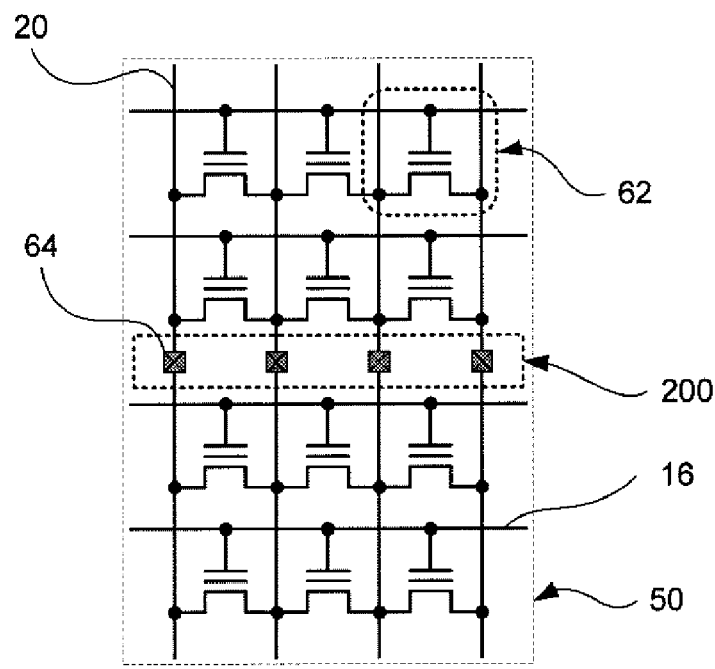
FIG. 2 is a schematic diagram depicting a portion of a virtual ground memory array comprising charge trapping memory elements.

FIG. 2 shows a schematic representation 50 of one embodiment of the method disclosed herein, in which memory array 12 has a NOR structure permitting selective control of word lines 16 and bit lines 20 to perform operations on a plurality of memory cells 62. The memory cells 62 of array 12 have a common structure including charge trapping structures and are arranged in columns and rows that are coupled together with a plurality of bit lines 20 and word lines 16. Bit line contacts 64 are disposed in bit line contact regions 200 that include silicide masks formed by the material used for the charge trapping structures in the memory cells. The bit line contacts are coupled to bit lines 20 to provide bit line decoder 18 a means of selectively controlling bit lines 20. In the technology discussed herein, the silicide masks formed by the material used for the charge trapping structures in the memory cells in the bit line contact regions 200 prevent silicide structures from forming between bit line contacts 64 during silicide formation steps, and in this manner shorting between bit line contacts is prevented.

Figure 3:
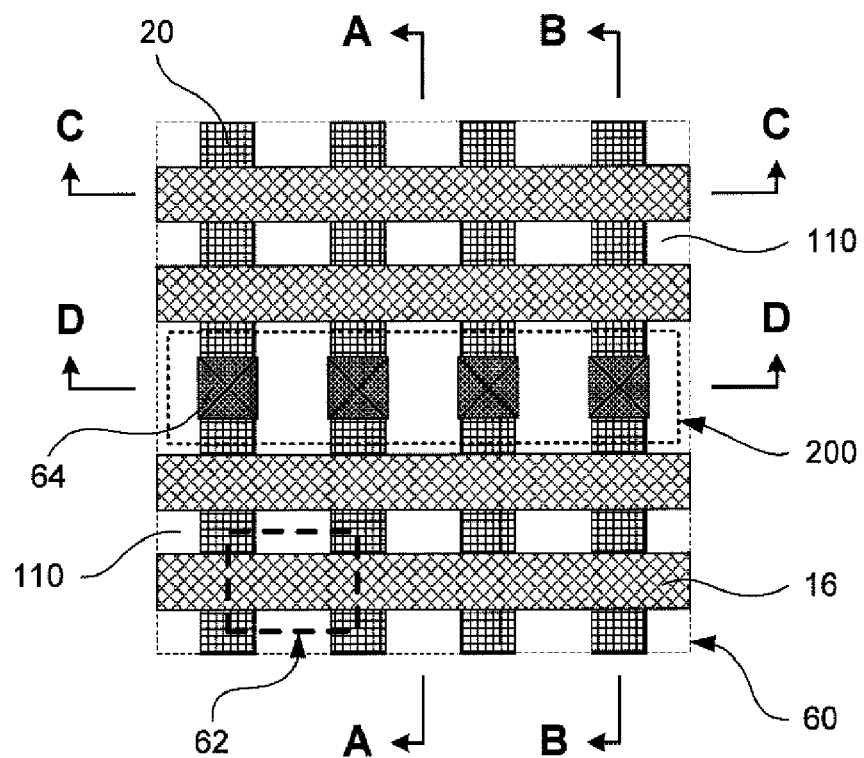
FIG. 3 shows a layout or plan view of a portion of a virtual ground memory array comprising charge trapping memory elements.

FIG. 3 illustrates a plan view of a portion 60 of memory array 12 according to one embodiment of the method discussed herein, comprising an array of memory cells 62 arranged in a NOR structure wherein bit lines 20 and word lines 16 may be selectively controlled to perform operations on a plurality of memory cells 62. Bit lines 20 comprise spaced-apart doped regions in memory substrate well. Word lines 16 are transversely superimposed over the array, with charge trapping structures 110 interposed between word lines 16 and gate dielectric regions between the bit lines 20. Word lines 16 comprise spaced-apart structures formed with a conductive silicon containing material such as doped polysilicon, amorphous polysilicon, or the like, which can be subjected to a silicide process, and further comprising a silicide formed thereon. The material used for the charge trapping structure extends across the bit line contact region 200. Bit line contacts 64 are vertically disposed through charge trapping material layer 110, which acts as a silicide masking structure in the contact regions 200, which lie between sets of word lines 16. Memory cells 62 are structures comprising portions of a pair of adjacent bit lines 20 and a portion of the superimposed word line 16, and further comprising a region of the interposed charge trapping structure 110. FIG. 3 shows broken lines A-A, B-B, C-C, and D-D, which define sectioning planes referenced as sectional views in subsequent figures.

FIGS. 4A, 4B and 4C show sectional views on lines A-A, B-B, and C-C of a portion 60 of memory array 12. FIG. 4A shows in addition, a sectional view of a high voltage transistor 70 and a low voltage transistor 80. Memory array 12 comprises charge trapping structure 110 superimposed on memory substrate well 102. The memory substrate well 102 is formed by dopant implantation in substrate 100. Word lines 16 are superimposed on charge trapping structure 110. Word lines 112, high voltage transistor gates 124, and low voltage transistor gates 134 are typically formed using a silicon-containing material such as one or more layers of doped polysilicon, amorphous polysilicon, or the like. An exemplary high voltage transistor 70 comprises high voltage dielectric 122, transistor gate 124, and substrate well 120. Substrate wells 120 are dopant implantations in substrate 100 formed by either P-polarity or N-polarity doping as may be required for the specific high voltage transistors being formed. A low voltage transistor 80 comprises transistor low voltage dielectric 132, transistor gate 134, and substrate well 130. Substrate wells 130 are dopant implantations in substrate 100 formed by either P-polarity or N-polarity doping as required to form individual low voltage transistors. A plurality of high voltage transistors 70 and low voltage transistors 80 may be required in the manufacture of particular embodiments of supply voltages charge pumps 36 and other regions of integrated circuit 10. To support higher operating voltages, high voltage dielectric 122 is formed to have a greater thickness in comparison to the thickness of low voltage dielectric 132. Word lines 112, high voltage transistor gates 124, and low voltage transistor gates 134 are capped with a hard mask 114 that protects their structure in manufacturing steps mentioned below.

Word lines 112 extend transversely to bit lines 20 and in superimposition to charge trapping structure 110. Bit lines 20 are doped implantation structures formed in memory substrate well 102, and oxide structures 116 are superimposed over bit lines 20. Charge trapping structure 110, composed of bottom dielectric layer 104, middle charge trapping layer 106 and top dielectric layer 108, is interposed between word lines 112 and the substrate. An exemplary memory cell 62 of memory array 12 comprises a portion of a word line 16 extending transversely over an adjacent pair of bit lines 20, and a memory cell 62 further comprises a region of charge trapping structure 110 interposed beneath a word line 16 and between bit lines 20.

FIGS. 4A-4B illustrate the formation of charge trapping structure 110 on substrate 100 of integrated circuit 10. Substrate 100 may be formed from any suitable material, such as silicon or other semiconductor substrate. A first region of dielectric material is a charge trapping structure 110, commonly referred to as an ONO structure, comprising bottom dielectric layer 104 and top dielectric layer 108 between which is disposed a middle charge trapping layer 106. Typically, charge trapping structure 110 has a thickness of between approximately 140 to 210 Å.

Charge trapping structure 110 is formed by patterning substrate 100 to deposit bottom dielectric layer 104, middle charge trapping layer 106, and top dielectric layer 108 as follows: bottom dielectric layer 104 comprises silicon dioxide that is deposited using standard chemical vapor deposition processes. Middle charge trapping layer 106 comprises silicon nitride that is deposited using standard chemical vapor deposition processes. Top dielectric layer 108 comprises silicon dioxide deposited using standard chemical vapor deposition processes. Other materials and combinations of materials may be used for the various layers of the charge trapping structure as known in the art. Preferably, the top layer of the charge trapping structure comprises the same material as used for the gate dielectric in the high voltage and low voltage transistors, or of a material that is more resistant to the etch chemistry used for removing the gate dielectric over the source and drain regions prior to self aligned silicide formation.

The method also discloses the fabrication of high voltage transistors 70 and low voltage transistors 80, which respectively incorporate high voltage dielectric 122 and low voltage dielectric 132 deposited on substrate 100. Transistors 70 may be operated at voltages relatively higher than the voltages of transistors 80 by using the method to fabricate high voltage dielectric structures 122 and low voltage dielectric structures 132 in portions of integrated circuit 10 where it may be desirable to provide peripheral transistors having higher and lower operating voltages, respectively.

High voltage dielectric structure 126 may, for example, be a silicon oxide approximately 170 Å thick. Low voltage dielectric structure 136 may, for example, be a silicon oxide approximately 65 Å thick.

The method discloses an improved method for fabricating salicided word lines 112 of memory array 12, and salicided control gates and source-drain regions of peripheral transistors 70 and 80, while also reducing oxide liner 156 (FIG. 7) losses and silicon nitride spacer 154 (FIG. 8) undercuts, as described below.

Word lines 112, and peripheral transistor gates 124 and 134 may, for example, be made by depositing a polysilicon layer having a thickness of approximately 2,000 Å over the charge trapping structure on substrate 100. The polysilicon layer may then patterned for word lines 112, and peripheral transistor control gates 124 and 134. A silicon dioxide hard mask 114 is then formed by exposing the patterned polysilicon to plasma enhanced chemical vapor deposition. The resulting hard mask has a thickness of approximately 700 Å and serves to facilitate etching to form word lines 112, and gates 124 and 134, by protecting the polysilicon beneath the patterned hard mask during etching, after which word lines 112 and transistor gates 124 and 134 have a hard mask 114 superimposed on their upper surface.

Figure 5:
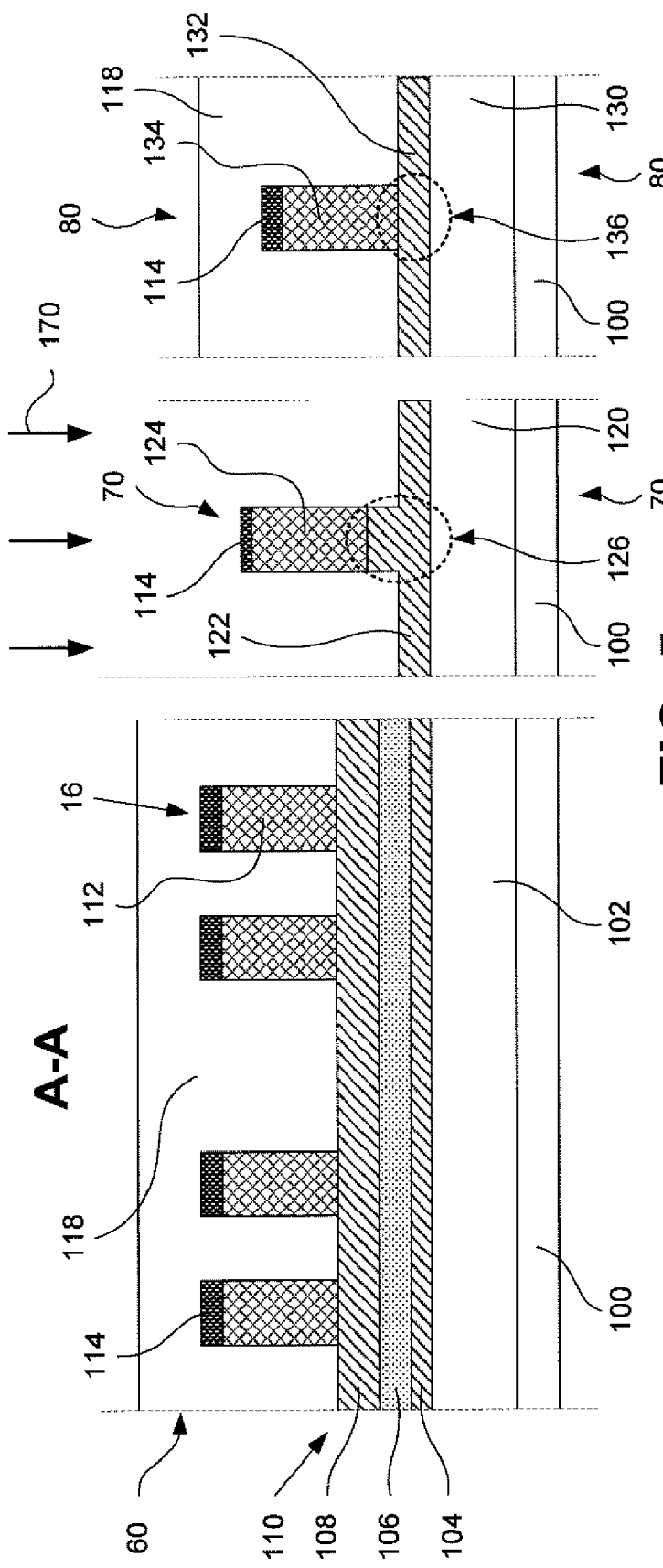
FIG. 5 is a sectional view along line AA of FIG. 3 after protecting the memory cells, and a sectional view of peripheral transistors illustrating a gate oxide etching step.

FIG. 5 shows sectional view A-A of a portion 60 of memory array 12, and a sectional view of a high voltage transistor 70 and a low voltage transistor 80. In an embodiment of the method, a protective resist 118, such as a photoresist or the like, is applied to memory array 12, low voltage transistors 80, and other regions of integrated circuit 10 that are to be protected from etchant 170. Protective resist 118 does not cover high voltage transistors 70, and etchant 170 is applied to reduce the thickness of high voltage dielectric 122 in the region surrounding high voltage transistor gate 124, to reduce the thickness of exposed high voltage dielectric 122 so that it approximately equals the thickness of low voltage dielectric 132. Hard mask 114 protects high voltage transistor gate 124 from etchant 170, and consequently, the region of high voltage dielectric 122 directly under high voltage gate 124 remains at its original thickness and is not reduced by etchant 170. In this manner, a high voltage gate dielectric 126 is formed having a greater thickness in the region under high voltage transistor gate 124. Protective resist 118 prevents etchant 170 from acting on low voltage transistor 80, and thus preserves the original thickness of low voltage dielectric 132 in the region surrounding low voltage transistor gate 134. In this manner, low voltage gate dielectric 136 is formed having a lesser thickness in the region under low voltage transistor gate 134. The method therefore provides for the formation of high voltage transistor gate dielectric 126 having a greater thickness in comparison to the thickness of low voltage transistor gate dielectric 136. The method also discloses using etchant 170 to reduce the thickness of high voltage dielectric 122 in the region surrounding high voltage gate 124, so that it is approximately equal to the thickness of low voltage dielectric 132. By ensuring that both high voltage dielectric 122 and low voltage dielectric 132 are approximately equal in thickness, the method discloses a process wherein subsequent etching and pre-salicide deposition cleaning steps can be performed in a manner that reduces or eliminates some of the undesirable effects that may arise if the oxide thickness between the gates of the high voltage transistors was not adjusted in this manner.

An etching step removes a portion of high voltage dielectric material 122 over the source and drain region, thus reducing the thickness of high voltage dielectric 122 to approximately 65 Å. In an exemplary process, a suitable region of integrated circuit 10 is masked with photo resist material, e.g., positive or negative photo resist, and subjected to a dry, anisotropic etch, such as a reactive ion etching process.

Figure 6A:
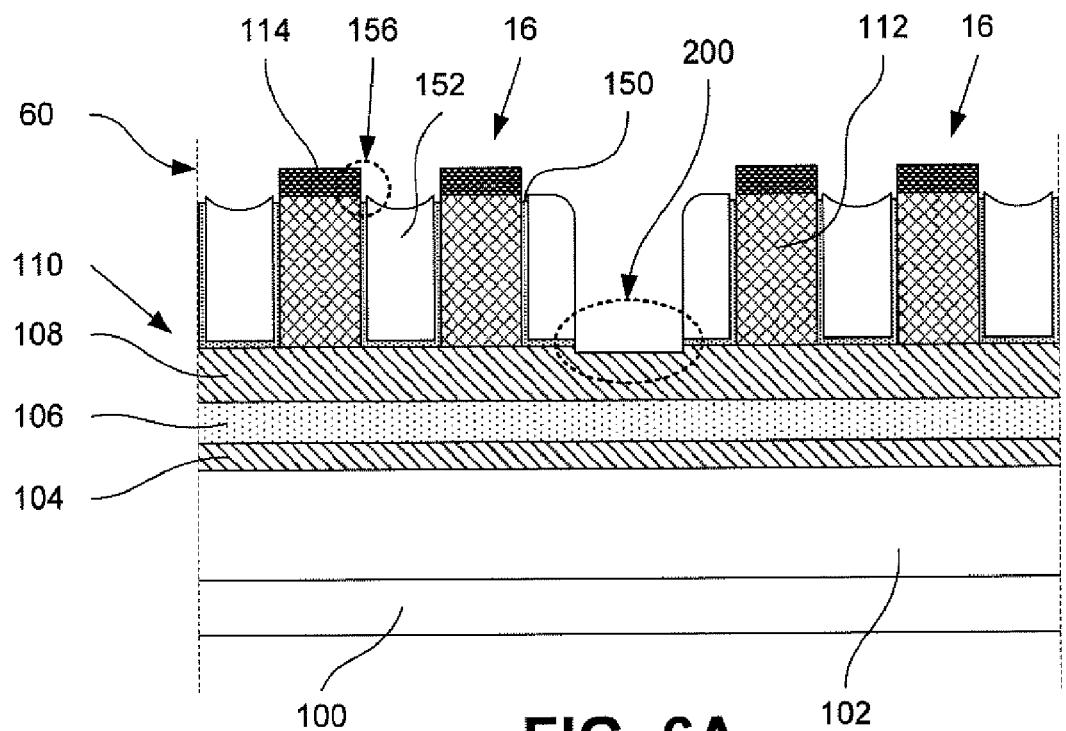
FIGS. 6A-6B show a sectional view along lines AA of FIG. 3 and a sectional view of peripheral transistors, illustrating a dielectric coating and spacer etching step.
Figure 6B:
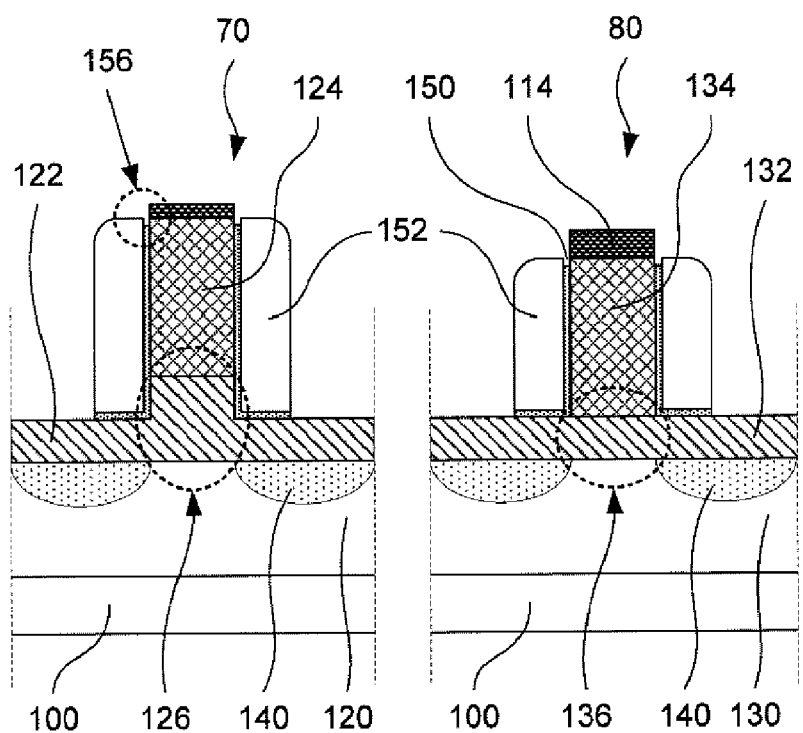

FIGS. 6A-6B show a sectional view A-A of a portion 60 of memory array 12, and a sectional view of a high voltage transistor 70 and a low voltage transistor 80 at a subsequent stage in the manufacturing process. With respect to memory array 12, the removal of protective resist 118 is followed by patterning and formation of an oxide liner 150 covering the word lines 112 and the top dielectric layer 108. Silicon nitride spacer 152 material is then deposited over oxide liner 150, and silicon nitride spacer 152 is formed by anisotropic etching. The etching used to form the spacer 152 exposes the charge trapping material in the bit line contact regions 200, where bit line contacts 64 of memory array 12 may subsequently be formed. For example the etch used to form the spacer 152 exposes the upper surface of top dielectric layer 108 of charge trapping structure 110. The etching of silicon nitride spacer 152 can cause the removal of a portion of oxide liner 150, which results in a slight oxide liner loss 156 between word lines 112 and silicon nitride spacer 152.

With respect to high voltage transistor 70 and a low voltage transistor 80, the removal of protective resist 118 is followed by patterning and lightly-doped drain (LDD) deposition of P- and N-source and drain regions 140 in transistors 70 and 80. An oxide liner 150 is deposited on high voltage transistor gate 124, high voltage gate dielectric 126, low voltage transistor gate 134, and low voltage gate dielectric 136. A silicon nitride spacer material is then deposited over oxide liner 150, after which silicon nitride spacer 152 is formed to expose portions of dielectric 122 over the source and drain regions of high voltage transistors, and portions of dielectric 132 over the source and drain regions of low voltage transistors, in order to facilitate the subsequent implantations of heavily-doped source and drain regions needed to manufacture transistors 70 and 80.

According to an aspect of the method, the same set of masks may be employed to dope the source and drain regions of high voltage transistors 70 and low voltage transistors 80, when an impurity implant process is undertaken, referred to as a lightly doped drain (LDD) process. For transistors 70 and 80, a given mask subset may be used to implant P-doped source/drain LDD regions, and a different mask subset may be employed to implant N-doped LDD regions: the masks and implant conditions are chosen to fabricate the desired devices. The impurity characteristics are dependent upon the application. For example, a P (hole) impurity, such as Boron, may be deposited or an N (electron) impurity, such as Arsenic, may be deposited. Lightly doped source and drain regions 140 may be formed in proximity to transistor gate dielectric regions 126 and 136 during the fabrication of transistors 70 and 80.

In an exemplary process, following the LDD deposition, a suitable protective mask pattern is placed on integrated circuit 10 and a conformal oxide liner 150 is deposited over word lines 16, transistors 70 and 80, and exposed bit line contact regions 200 of top dielectric layer 108 disposed between adjacent word lines 16. Oxide liner 150 may be deposited employing standard chemical vapor deposition techniques, to provide a conformal oxide liner 150 with a thickness of approximately 150 Å.

Following the formation of oxide liner 150, a silicon nitride layer may be deposited using standard chemical vapor deposition techniques to form a silicon nitride (SiN) layer with a thickness of approximately 750 Å.

After it is deposited, the silicon nitride layer is exposed to a two step etch process in order to form silicon nitride spacer 152. Spacer 152 includes a portion of the silicon nitride layer and is in contact with portions of oxide liner 150. The first etch step removes portions of the silicon nitride layer, exposing hard mask 114, as well as exposing silicide masking bit line contact regions 200 on top dielectric layer 108 between word lines 112.

The second etch step may involve a fluorine based overetch, which reduces the thickness of peripheral dielectrics 122 and 132, as well as removing a portion of top dielectric layer 108 exposed in bit line contact regions 200 disposed between word lines 112. Consequently, the over etching step reduces the amount of pre-salicide clean etching subsequently required to remove dielectric materials and hard mask layers. By shortening pre-salicide clean etching, over etching reduces the extent of oxide liner losses 156 and silicon nitride spacer undercuts 154 [FIG. 8] that could otherwise result from pre-salicide clean etching.

FIG. 7 shows sectional view A-A of a portion 60 of memory array 12, and a sectional view of a high voltage transistor 70 and a low voltage transistor 80, where a protective resist 118 has been applied to shield integrated circuit 10 while exposing peripheral transistors 70 and 80 to dopant flux 172 to implant heavily-doped source and drain regions 142 in high voltage substrate well 120 and low voltage substrate well 130. The P+ and N+ dopant concentrations formed in heavily-doped source and drain regions 142 are higher than the P− and N− dopant concentrations formed earlier in LDD source and drain regions 140. Source and drain regions 140 and 142, in combination with substrate wells 120 and 130 may be selectively doped to form transistors having either P-MOS or N-MOS polarity. The peripheral transistors thus formed may be utilized to manufacture the CMOS circuitry functions of integrated circuit 10.

The thickness reduction of high voltage dielectric 122 to approximately equal the thickness of low voltage dielectric 132 improves chip fabrication by reducing the number of processing steps required to manufacture high voltage and low voltage transistors, because approximately equal dielectric thicknesses permit shared use of patterning masks and implantation conditions for the formation of heavily-doped (P+ and N+) source and drain regions 142.

Following the over etch, integrated circuit 10 is protected by a patterned photo resist over memory array 12 and other areas, that exposes dielectrics 122 and 132 for the purpose of performing dopant implantations in source and drain regions 142 of peripheral transistors 70 and 80. The type and concentration of impurities is selected to establish the deep source and drain junctions of transistors associated with the peripheral circuitry. During implantation of dopant impurities into substrate wells 120 to form deep source and drain junctions 142, gates 124 and 134 protected by hard mask 114, and their associated silicon nitride spacers 152, also function as a mask.

FIG. 8 shows sectional view A-A of a portion 60 of memory array 12, and a sectional view of a high voltage transistor 70 and a low voltage transistor 80, after a pre-salicide clean etching step is used to remove hard mask 114 from the upper surface of word lines 112, high voltage gates 124, and low voltage gates 134, and also to remove the exposed dielectric 122 and dielectric 132 on drain and source regions 142.

The amount of pre-salicide cleaning necessary to prepare for salicide deposition is shortened because etchant 170 in FIG. 5 reduced the thickness of high voltage dielectric 122 to approximately match low voltage dielectric 132. Consequently, a shortened cleaning step suffices to remove the exposed dielectric 122 under the same conditions needed to remove exposed dielectric 132. Shortening the pre-salicide cleaning step also reduces the extent of oxide liner losses 156 and silicon nitride spacer undercuts 154 that are an undesired consequence of pre-salicide cleaning. It also prevents complete removal of the material used for charge trapping structures in the bit line contact regions 200, so that the remaining portions of the charge trapping structure material act as a silicide mask.

The technology discussed herein discloses reducing the thickness of dielectric 122 to approximately match the thickness of dielectric 132 as a means to shorten the pre-salicide cleaning necessary to prepare integrated circuit 10 for silicide deposition. A shortened pre-salicide cleaning step also reduces conformal dielectric coating losses 156 and silicon nitride spacer undercuts 154, and the reduction of liner losses and spacer undercuts contributes to manufacturing higher quality transistors 70 and 80.

Following the implantation of dopant impurities in source and drain regions 142, a wet etch step is performed to remove hard mask 114 and portions of peripheral dielectrics 122 and 132, in order to expose the upper surfaces of polysilicon word lines 112 and gates 124 and 134, and to expose source and drain regions in the substrate wells 120 and 130. In an exemplary process using a NH4OH:H2O2:H2O mixture is used, followed by a mixture of HCL:H2O2:H2O. Then a H2O:HF solution is applied ending the etch, followed by an Isopropyl Alcohol (IPA) cleaning and drying step.

Figure 9:
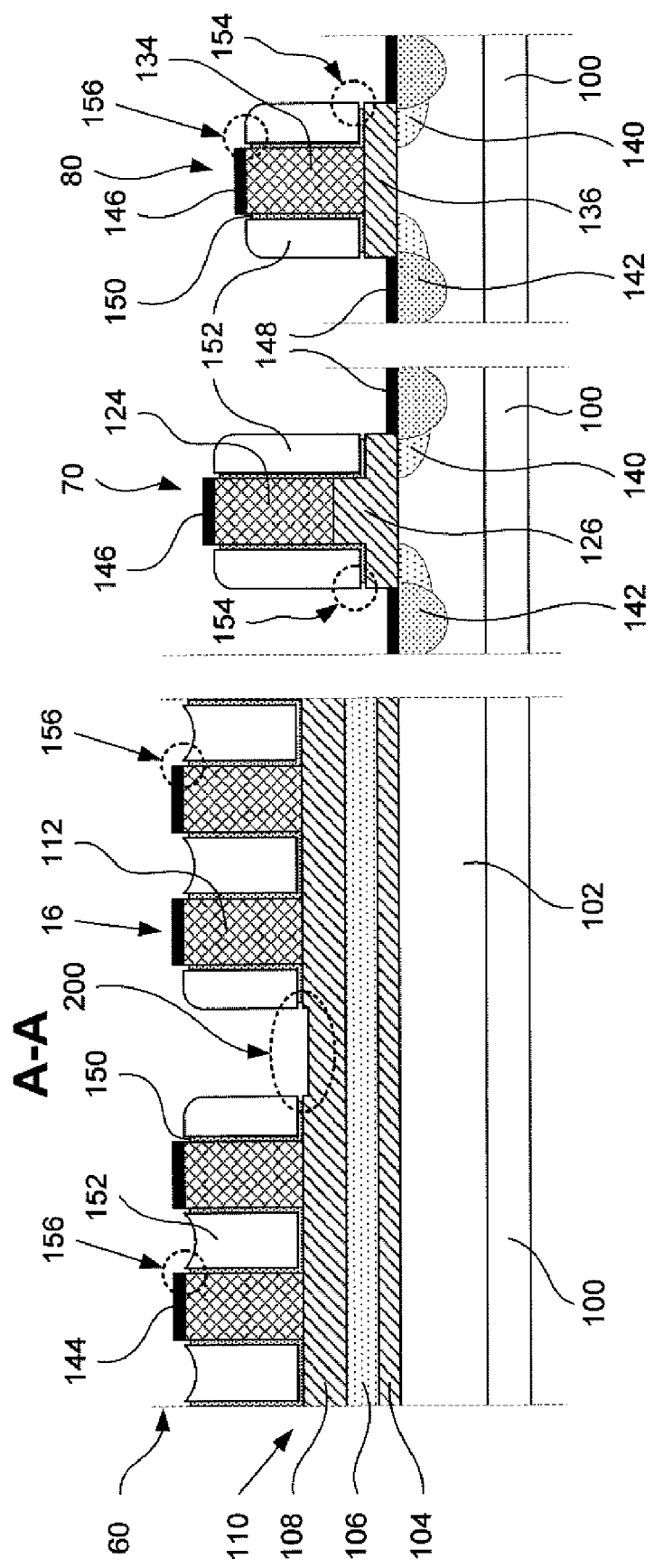
FIG. 9 is a sectional view along line AA of FIG. 3 and a sectional view of peripheral transistors, illustrating self-aligned silicide (salicide) deposition.

FIG. 9 illustrates a sectional view A-A of a portion 60 of memory array 12, and a sectional view of a high voltage transistor 70 and a low voltage transistor 80, after the formation of a silicide, such as cobalt silicide (CoSi2), titanium silicide (TiSi2), or the like, to provide reduced resistance on regions of integrated circuit 10 comprising, for example, silicide contacts 144 on word lines 112 of memory array 12, silicide contacts 146 on high voltage transistor gates 124 and low voltage transistor gates 134, and silicide contacts 148 on source and drain regions 142 of high voltage transistors 70 and low voltage transistors 80. The method further discloses preventing the formation of shorts between bit lines when forming salicide contacts 144, 146, and 148, by preventing silicide deposition in the bit line contact regions 200 on top dielectric layer 108.

Following the wet etch cleaning step, a self-aligned silicide deposition process termed "saliciding" is undertaken. In one embodiment, cobalt may be deposited on regions comprising silicon-containing word lines 112, transistor gates 124 and 134, and the exposed regions of source/drain junctions 142 of substrate wells 120 and 130. The deposited cobalt is converted to cobalt silicide through a thermal annealing process that includes covering the cobalt deposition layer with a titanium nitride capping layer that provides thermal stability aiding silicide formation during rapid thermal processing.

The method discloses the deposition of cobalt on regions of the device where salicide formation is desirable. Accordingly, the method discloses the selective formation of silicide in regions such as word lines, and peripheral transistor gates, sources and drains, where silicide is formed by exposing the deposited cobalt to a rapid thermal process (RTP) that causes a phase transition combining cobalt and Silicon to form cobalt silicide. The method also discloses preventing the formation of silicide on regions where, although cobalt is deposited, its conversion to silicide would cause undesirable electrically conductive paths.

Consequently, the method discloses the deposition of cobalt followed by a rapid thermal processing step which selectively forms silicide where its presence is advantageous. After a first rapid thermal process to selectively form silicide, the method discloses a cleaning and etching step to remove unwanted cobalt, titanium nitride, and other impurities, followed by a second rapid thermal process step to complete silicide formation. The technology discussed herein discloses the formation of silicide structures on word lines and peripheral transistors, to improve their performance, while at the same time, the technology discloses preventing the formation of silicide shorts between the bit line contacts of the memory array.

The cobalt may be deposited to form a layer of about 130 Å. A titanium nitride (TiN) capping layer with a thickness of approximately 150 Å is then deposited.

A rapid thermal process (RTP) is next performed by heating the salicide a ramp rate to convert cobalt and silicon to cobalt silicide by progressively heating them. In this manner, the cobalt layer reacts with the silicon-containing regions on which it has been deposited to form cobalt silicide (CoSi). It is understood that other silicides may also be formed in this manner by depositing titanium, arsenic, doped nickel, or alloys thereof, in a manner similar to the example described herein using cobalt.

The structure then undergoes a selective cleaning and etching process to remove the TiN capping layer and clean deposited cobalt and impurities from device structures where silicide formation is not desired. For example, bit line contact regions 200 are thus cleaned. In an exemplary process, a CoSi selective clean and etch, by applying an SC1 solution consisting of NH4OH:H2O2:H2O, followed by an HF etch.

The salicide deposition is next exposed to a second rapid thermal process performed by heating the salicide using a gas flow of N2, which induces a phase transition by progressively heating. In this manner, the cobalt silicide (CoSi) undergoes a phase transition with surrounding silicon-containing structures that transforms CoSi to the intended cobalt silicide (CoSi2) having low resistivity. FIGS. 10A-10D show sectional views A-A, B-B, C-C, and D-D respectively of a portion 60 of memory array 12, after the formation of bit line contacts 64 extending through charge trapping structure 110, buried diffusion oxide 116, and inter-layer dielectric 160, to establish connections with bit lines 20 of memory array 12. The technology discussed herein discloses forming self-aligned silicide layers 144 on word lines 112 and other portions of integrated circuit 10, while preventing undesired silicide formation in the bit line contact regions 200, thereby preventing the formation of shorts between bit line contacts 64 when they are subsequently formed.

Figure 11A:
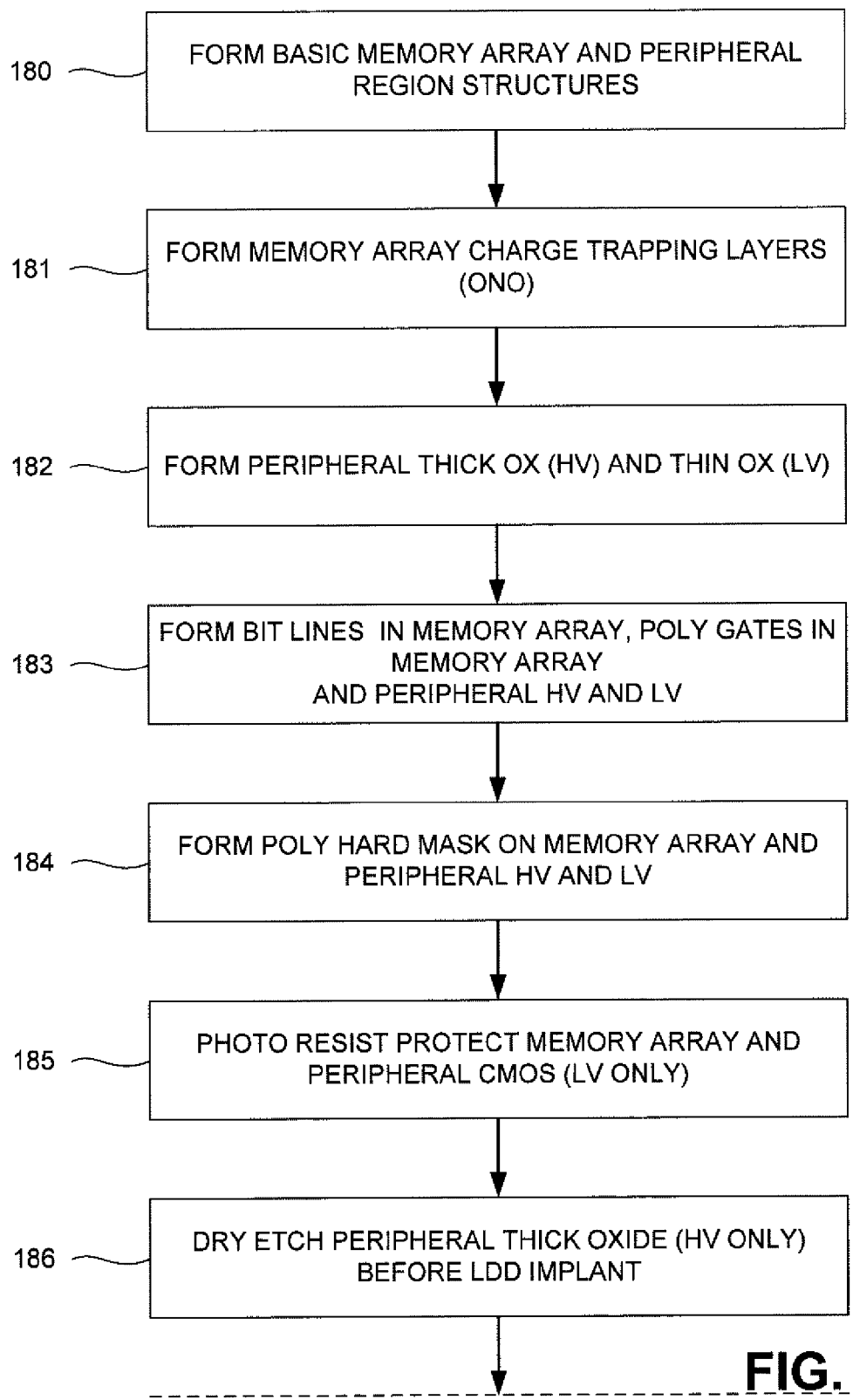
FIGS. 11A-11B show a flow chart of a method according to one aspect of the technology discussed herein.
Figure 11B:
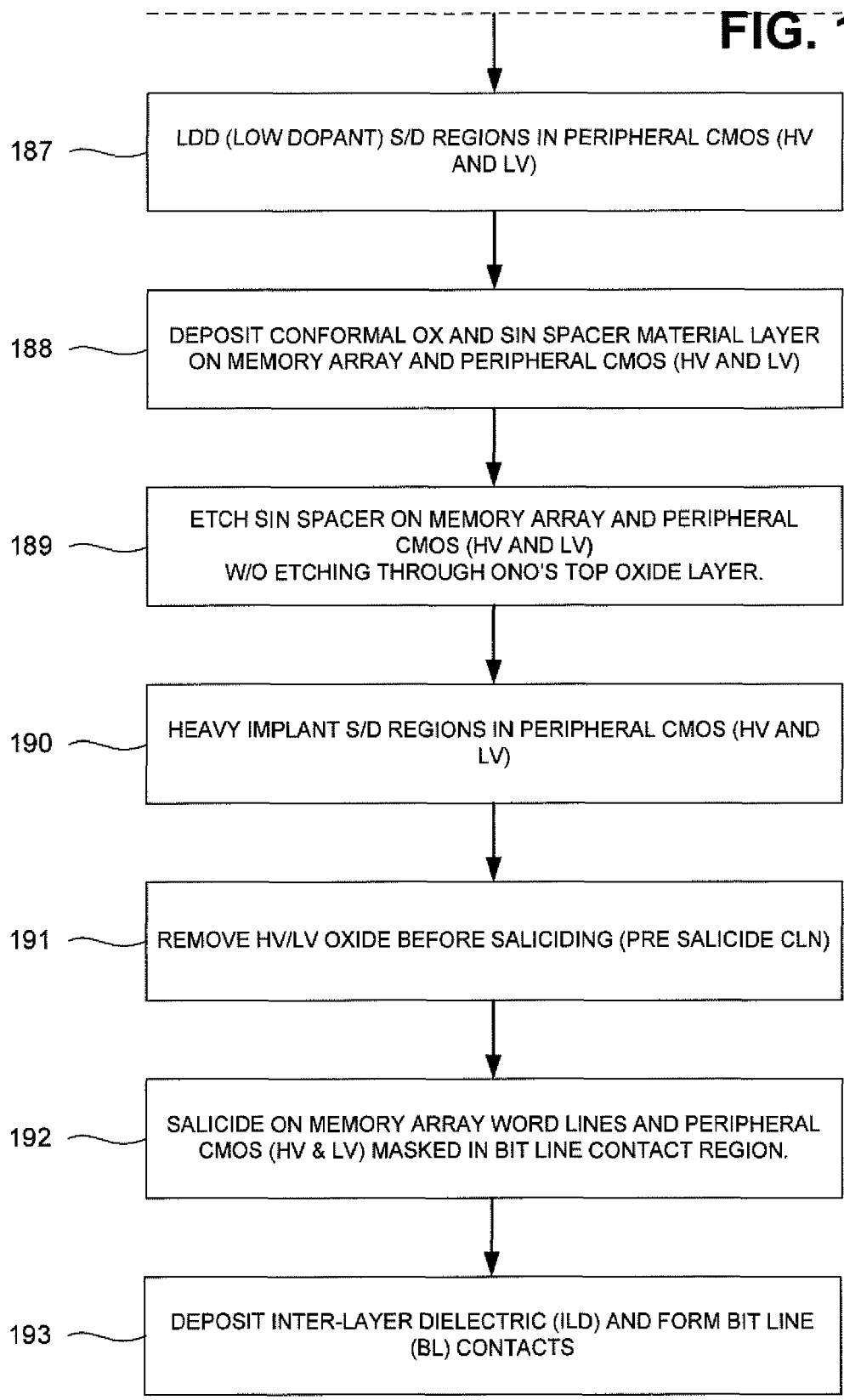

FIGS. 11A-11B show a flow chart of the method according to one aspect of the technology discussed herein. The sequence begins with act 180, forming basic components for building devices in the memory array and peripheral regions, comprising shallow-trench isolation structures (STI), peripheral N-wells and P-wells, and the memory array P-well, as well as other basic structures required to initiate the formation of integrated circuit 10 on substrate 100. The semiconductor substrate is generally silicon, but can be any suitable semiconductor such as GaAs or InP, for example. Act 181 involves the formation of charge trapping structure 110 of memory array 12, such as a multilayer stack of silicon oxide, silicon nitride and silicon oxide (ONO), or other charge trapping structures. Act 182 involves forming peripheral structures of thicker high voltage dielectric 122 and a thinner low voltage dielectric 132. Act 183 involves the implanting dopants to provide conductive bit lines 20 in memory substrate well 102, the formation of word lines 112 over the charge trapping structure layers in memory array 12, and the formation of peripheral high voltage gates 124 and low voltage gates 134. Act 184 involves the formation and patterning of hard mask 114 on memory array 12 and high voltage transistors 70 and low voltage transistors 80. Act 185 involves the application of a protective resist 118 to protect memory array 12 and low voltage transistors 80.

Act 186 involves using etchant 170 to reduce the thickness of portions of high voltage dielectric 122 to make them approximately equal in thickness to low voltage dielectric 132. Act 187 involves the dopant deposition for "lightly doped drain" (LDD) structures in source and drain regions in high voltage transistors 70 and low voltage transistors 80. Act 188 involves the deposition of liner 150, comprising silicon oxide for example, and dielectric spacer material layer 152, comprising for example silicon nitride or other material that can be selectively etched as described herein to form sidewall spacers, on memory array 12 and transistors 70 and 80. Act 189 involves the etching of spacer material to form spacers 152 in the peripheral areas, with residual spacer material in memory array 12, and to expose top layer 108 of the charge trapping structure, without etching through to middle charge trapping layer 106, in the bit line contact regions 200. Act 189 also involves etching silicon nitride spacer material to form spacers 152 on peripheral transistors 70 and 80, removing at least a portion of the liner 150 to expose source and drain regions on dielectric structures 122 and 132.

Act 190 involves dopant implantation of P+ and N+ source and drain regions 142 in high voltage transistors 70 and low voltage transistors 80, sharing source and drain masks and implantation conditions between high voltage and low voltage source-drain implantations when possible, in order to reduce the number of manufacturing steps. Act 191 involves a pre-silicide formation cleaning step that removes hard mask 114 from word lines 112 and transistor gates 124 and 134, and which also removes the exposed portions of dielectric structures 122 and 132 over peripheral transistor source and drain regions 142.

Act 192 involves the formation of self-aligned silicide ("salicide") layers 144 on word lines 112; the formation of self-aligned silicide transistor gate layers 146 on high voltage transistor gates 124 and on low voltage transistor gates 134; and the formation of self-aligned silicide layers 148 on transistor source and drain regions 142.

Act 193 involves deposition of inter-layer dielectric structure 160 and the formation of bit line contacts 64 disposed in vias through inter-layer dielectric 160 and charge trapping structure 110. The absence of silicide in the bit line contact regions 200 prevents the formation of bit line shorts between bit line contacts 64.

The technology discussed herein includes an improved method of fabricating charge trapping memory arrays and their peripheral circuits. The method provides for the manufacture of memory arrays having reduced dimensions, by reducing the resistance of word lines through saliciding, while preventing the formation of undesired connections ("shorts") between bit lines during salicide deposition.

Charge trapping memory arrays require peripheral circuitry for their operation. The peripheral circuitry includes transistors capable of operating at a high voltage as well as transistors capable of operating at a low voltage. The gate oxide thickness of the peripheral transistor varies in accordance with their operating voltage, such that high voltage transistors have thicker gate oxide relative to low voltage transistors. The method discloses reducing the dielectric thickness overlying source and drain regions for high voltage transistor gates to approximately match the thickness of low voltage gates, while maintaining thicker gate dielectrics.

The method discloses etching to reduce the high voltage dielectric thickness over the source and drain regions adjacent gates, prior to subsequent spacer etching and pre-salicide deposition cleaning steps. By providing a reduction in the thickness of the dielectric beneath the spacers, and in the length of pre-salicide cleaning steps, the method reduces the amount of conformal dielectric coating loss and spacer undercutting that occurs during chip fabrication. It is desirable to reduce the amount of oxide loss and undercutting because they permit the unintended entry of dopants into certain regions of the memory array and peripheral circuits, which results in a degradation of memory and transistor performance. Memory and chip performance are improved by reducing oxide loss and undercutting.

While the method is disclosed by reference to the embodiments and examples detailed above, it is to be understood that these are intended in an illustrative rather than in a limiting sense. It is contemplated that modifications and combinations will occur to those skilled in the art, which modifications and combinations will be within the spirit of the technology disclosed herein and the scope of the following claims.

We claim:

1. An integrated circuit, comprising:
a memory array in a first area of a substrate, the memory array including a plurality of word lines comprising a conductive material including a silicide layer, a plurality of bit lines comprising doped substrate regions, and a plurality of memory cells, the memory cells in the plurality comprising source and drain regions in the plurality of bit lines and a multilayer charge trapping structure having a first thickness, and including a top layer of dielectric, a bottom layer of dielectric and a charge trapping layer or charge trapping layers between the top layer and the bottom layer;
an interlayer dielectric layer and conductor structure overlying the memory array;
bit line contacts, connecting the conductor structure to the bit lines in the plurality of bit lines through the interlayer dielectric, in areas between groups of word lines in the plurality of word lines, wherein material deposited during formation of the charge trapping structures overlies the substrate beneath the interlayer dielectric between bit line contacts;
transistors on the substrate having gate dielectric layers with a second thickness; and
transistors on the substrate having gate dielectric layers with a third thickness, wherein the third thickness is greater than the second thickness.

2. An integrated circuit as in claim 1, wherein the gate dielectric layers comprise a gate dielectric material, wherein at least one of the transistors having gate dielectric with the third thickness includes a gate with a dielectric sidewall spacer with a bottom surface, and a layer of the gate dielectric material between the bottom surface of the sidewall spacer and the substrate having a thickness equal to about the second thickness.

* * * * *